United States Patent [19]

Frijlink et al.

[11] Patent Number: 5,643,807
[45] Date of Patent: Jul. 1, 1997

[54] METHOD OF MANUFACTURING A SEMICONDUCTOR DEVICE COMPRISING A BURIED CHANNEL FIELD EFFECT TRANSISTOR

[75] Inventors: Peter M. Frijlink, Crosne; Michel Iost, Boussy-Saint-Antoine, both of France

[73] Assignee: U.S. Philips Corporation, New York, N.Y.

[21] Appl. No.: 491,753

[22] Filed: Jun. 19, 1995

[30] Foreign Application Priority Data

Jun. 29, 1994 [FR] France ................... 94 08011

[51] Int. Cl.$^6$ ............ H01L 21/265; H01L 21/203; H01L 21/44; H01L 21/20
[52] U.S. Cl. ............ 437/39; 437/107; 437/126; 437/133; 437/175; 437/203; 437/912
[58] Field of Search ................ 437/39, 107, 126, 437/133, 175, 203, 912

[56] References Cited

U.S. PATENT DOCUMENTS

| | | |
|---|---|---|
| 4,742,026 | 5/1988 | Vatus et al. ............... 437/245 |
| 4,908,325 | 3/1990 | Berenz ....................... 437/39 |
| 5,229,320 | 7/1993 | Ugajin ....................... 437/107 |
| 5,352,909 | 10/1994 | Hori .......................... 437/203 |
| 5,364,816 | 11/1994 | Boos et al. ................ 437/126 |
| 5,389,574 | 2/1995 | Mizunuma .................. 437/912 |

FOREIGN PATENT DOCUMENTS 6189681  5/1986  Japan ................ H01L 29/80

OTHER PUBLICATIONS

1992 IEEE MTT-S International Microwave Symposium Digest (CAT. No. 92CH3141-9), Albuquerque, NM, USA, 1–5 Jun. 1992, ISBN 0-7803-0611-2, 1992, New York, NY, USA, XP 000343118, Shanfield et al "One Watt, Very High Efficiency 10 and 18 Ghz Pseudomorphic HEMT's Fabricated by Dry First Recess Etching", pp. 639–641 and cover sheet.

*Primary Examiner*—John Niebling
*Assistant Examiner*—Brian K. Dutton
*Attorney, Agent, or Firm*—Michael E. Schmitt

[57] ABSTRACT

A method of manufacturing a semiconductor device with a buried channel field effect transistor, comprising the formation of a stack of layers on a substrate with an active semiconductor layer having a non-zero aluminium (Al) content, a semiconductor cap layer without aluminium (Al), a masking layer provided with a gate opening; a first selective etching step with a first etching compound containing fluorine (F) in the cap layer down to the upper surface of the active layer, whereon a stopper layer of aluminium fluoride (AlF$_3$) is formed automatically; then elimination of the stopper layer; a second, non-selective etching step in the active layer with a second etchant until a first, central gate recess is completed; a third, selective etching process with the first etchant in the cap layer, which takes place laterally for forming the flanks of a second recess whose bottom is the upper surface.

21 Claims, 2 Drawing Sheets

METHOD OF MANUFACTURING A SEMICONDUCTOR DEVICE COMPRISING A BURIED CHANNEL FIELD EFFECT TRANSISTOR

FIELD OF THE INVENTION

The invention relates to a method of manufacturing a semiconductor device comprising a buried channel field effect transistor.

The invention is applied in particular to the realisation of integrated semiconductor devices comprising high electron mobility transistors (HEMT).

BACKGROUND OF THE INVENTION

A method of manufacturing a buried channel field effect transistor comprising the formation of a two-stage gate recess is known from the present-art Japanese Patent Application published under no. 61-89681/86 (also available in the form of an English abstract.

This known method comprises at least the following operations for realising the specific field effect transistor:
  the formation of semiconductor layers (substrate) and of ohmic source and drain contacts,
  the formation of two superimposed masking layers: a first, purely dielectric layer or spacer layer, and a second, photoresist layer;
  etching of an opening having dimensions corresponding to the future gate in said masking layers,
  etching of a first, central recess in the subjacent semiconductor material down to a first depth, with transverse dimensions defined by those of the opening in the photoresist layer,
  lateral etching of the first spacer layer for delimiting in this layer an enlarged opening towards the sides, below the photoresist layer,
  etching of the subjacent semiconductor material, which etching comprises:
    renewed etching of the first, central recess down to a second depth, greater than the first,
    etching of a second, peripheral recess having transverse dimensions defined by those of the enlarged opening formed in the spacer layer, and having an intermediate depth between the surface of the semiconductor material and the bottom of the first, central recess,
  wherein the subsequent etching steps carried out in the dielectric spacer layer and in the subjacent semiconductor material are carried out by means of selective chemical etching agents, one for the dielectric material, the other for the semiconductor material.

The result of these various operations is that the transistor exhibits a buried channel at two levels, with a first, central recess having the smaller dimension in transverse direction and a bottom level at greater depth for receiving the gate contact metal, and with a second, peripheral recess having the greater transverse dimension and a bottom level at an intermediate depth between that of the surface of the semiconductor material and that of the first, central recess.

It follows from the teachings in the cited document that two dielectric layers (the spacer and photoresist layers) are necessary for carrying out the known method satisfactorily; and that the final level of the first, central recess, which receives the gate contact, and which thus defines the effective depth of the transistor channel, is obtained by two successive chemical etching steps, i.e. a first etching step down to a first depth, and a second, repeated etching step down to a second depth.

Now the realisation of buried channel field effect transistors at two levels leads to manufacturing problems.

A first manufacturing problem lies in the fact that it is necessary in practice to realise several thousands of transistors which are absolutely identical simultaneously on one substrate of large diameter (at least 7 cm). If the means for controlling the etching depths to desired values are not provided, the etched depths will be on the one hand inaccurate and badly reproducible, and on the other hand these depths will be different at the centre and at the outside regions of the substrate. This results in the manufacture of transistors with dispersion in their electronic properties, and thus a lower useful manufacturing output.

The known method has the disadvantage that it leads to the realisation of the first, central recess in two successive etching steps, without indicating means for controlling the exact depth of each of these etching steps or means for automatically stopping the etching at an exact desired depth. The depth obtained by the two successive etching steps will thus be inaccurate and badly reproducible. The transistors realised on the total surface of a substrate will in addition exhibit dispersion in their characteristics. A second manufacturing problem lies in the fact that the designer of integrated circuits nowadays aims at transistors of a more complicated structure than the transistor realised by the known method. Nevertheless, these more complicated transistors must be manufactured in the smallest possible number of steps for reasons of economy.

The known method has the disadvantage that it utilizes two masking layers. Of these two layers, the photoresist layer is removed by lifting-off at the end of the process, after the manufacture of the metal gate contact, whereas the spacer layer is conserved as a protective layer. This conservation of the spacer layer, however, does not provide a sufficient protection because this layer has the disadvantage that it does not protect the gate region. The result is that this layer is useless in the final stage, when the manufacturer of the integrated circuit must provide a supplementary, effective protection layer which is not described. The formation of the spacer layer thus prolongs the known method in an unfavourable way.

Another manufacturing problem connected with the realisation of more complicated transistors than the one obtained by the known method lies in the fact that it is not indicated how the buried channel should be realised with a two-stage gate recess when different semiconductor materials disposed in successive layers are encountered during etching of this two-stage recess.

A solution to this latter problem must be found while also taking into account other problems as indicated above, i.e. a method must be provided wherein the etching depths are well controlled, well reproducible, substantially identical over the entire surface of the processed substrate, and the method must comprise as few steps as possible.

SUMMARY OF THE INVENTION

According to the invention, a method is proposed for realising a field effect transistor which has an improved performance, in which the disadvantages of the known method are avoided, and in which the above problems are resolved.

These objects are achieved by means of a method of manufacturing a semiconductor device comprising a buried channel field effect transistor which comprises at least:
  realisation of a stack of layers on a substrate, with in that order:
    an active layer made of a semiconductor compound which a non-zero aluminium (Al) content in which a first, central recess is to be dug for receiving a Schottky gate contact, a cap layer made of a semiconductor material without aluminium (Al) for receiving the ohmic source and drain contacts of the transistor, a masking layer provided with an opening called gate opening, carrying out of etching steps for providing the first, central gate recess by self-alignment on the gate opening, comprising in that order:

a first selective etching step with a first etching compound of fluorine (F) carried out in the cap layer through the gate opening and down to the upper surface of the active layer, on which a stopper layer of aluminium fluoride ($AlF_3$) will be formed automatically through a reaction between the fluorine of the etching compound and the aluminium of the semiconductor compound of the active layer, elimination of the etching stopper layer of aluminium fluoride ($AlF_3$), a second, non-selective etching step carried out in the active layer through the gate opening with a second etching agent until the first, central gate recess has been completed.

An advantage offered by this method is that it includes the formation of a so-called cap layer which renders it possible to reduce the access resistances of the source and drain.

Another advantage offered by this method is that it includes the formation of a layer of an aluminium compound as the upper layer of the channel, which renders possible the formation of a heterostructure in the channel layer, and thus the realisation of a high electron mobility transistor (HEMT). Another advantage offered by the method according to the invention is that an etching stopper layer is formed, not during the realisation of the semiconductor layers before each etching step, but by contrast during one of these etching steps itself for stopping this ongoing etching step, and that this stopper layer thus formed has remarkable properties:

it is formed automatically during said etching step in a reproducible position, which is the upper surface of the active layer, and indeed over the entire surface of the substrate under treatment, it stops automatically said ongoing etching step at this level, which serves as a reproducible reference over the entire surface of the substrate under treatment, it is formed to a thickness which is sufficiently great for stopping the ongoing etching step, it is formed to a thickness which is sufficiently small for being readily eliminated without prolonging the process or disturbing surfaces already formed: typically, this stopper layer has a thickness of one or two atomic monolayers (0.3 to 0.6 nm).

Another advantage offered by this method is that the etching stopper layer used is eliminated in the course of the process. This advantage lies more particularly in the fact that said stopper layer no longer exists in the finished transistor, and therefore the transistor thus formed does not have its performance impaired by parasitic layers, in contrast to transistors which still contain stopper layers in the finished state: it is in fact evident that, taking into account the submicron dimensions nowadays used in transistors, any unnecessary element of however small dimensions will interfere with the operation; for example, it is known that certain stopper layers maintained at the end of the process introduce parasitic resistances and produce trapping effects;

it is also known that certain stopper layers whose composition is on the contrary capable of reducing access resistances are not voltage-resistant and lead to disruptive breakdowns in particular in present-day submicron transistors.

A further advantage offered by the method according to the invention is that the bottom level of the central portion of the two-stage gate recess is realised in a single etching step starting from a level which is well defined by the stopper layer. Consequently, this level, whose position is very important for defining the thickness of the active layer, is now obtained by an etching step which can be well controlled, and is thus itself well defined. In fact, the material thickness which is to be etched away in the non-selective etching step is very small, starting from the moment the stopper layer has been eliminated, and thus the error which may be produced in such a small etched depth can only be very small. The positional accuracy of the bottom level of this central portion is the more important as it is known that the enhanced or depleted thicknesses, which are of importance for blocking or rendering the transistor conducting, are extremely small. Any inaccuracy in the final thickness of the channel will result in catastrophic variations in the performance of the finished transistor. The performance of the transistor according to the invention is thus assuredly very good, reliable, and reproducible in the course of the manufacturing process over several thousands of transistors distributed over a large surface area.

In an embodiment, the method is characterized in that it comprises in addition, for making a second gate recess which is less deep and which has greater lateral dimensions than the first, the implementation of subsequent etching steps, which include in that order:

a third selective etching step with the first etching compound of fluorine (F), carried out in the cap layer laterally only for forming the flanks of the second recess whose bottom is formed by the upper surface of the subjacent layer.

In this embodiment, the transistor obtained by the method shows an improved breakdown voltage without a deterioration in its access resistances. The method used for achieving this object is particularly simple, and thus advantageous on an industrial scale. Moreover, the steps for realising the second gate recess do not deteriorate the first gate recess whose accuracy, as we have seen, is of the greatest importance.

BRIEF DESCRIPTION OF THE DRAWINGS

The invention will be explained in detail below with reference to the annexed diagrammatic Figures, in which.

DESCRIPTION OF EMBODIMENTS

Figure 1:
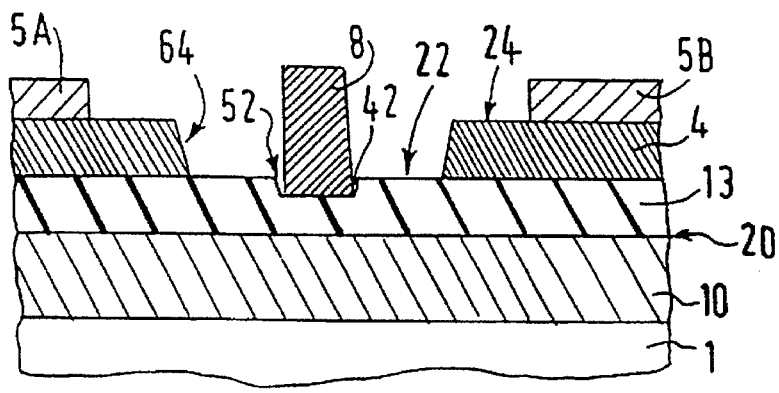
FIG. 1 shows a buried channel field effect transistor with two levels.

The invention relates to a method of manufacturing a semiconductor device comprising at least a buried channel transistor on a substrate.

The invention will be described in its application to the manufacture of high electron mobility transistors (referred to as HEMT hereinafter).

The properties of the HEMT are known per se to those skilled in the art of integrated circuits, whether digital or analog, in all technologies, and are accordingly not described any further below.

Generally, the HEMT comprises a stack of active layers realised on a substrate 1, among which at least:

- a first layer 10 of a first material of small forbidden bandwidth, weakly doped;
- a second, active layer 13 of a second material of greater forbidden bandwidth, strongly $n^{++}$ type doped, forming a heterostructure with the first layer 10 with an interface 20;
- a third layer 4, strongly doped $n^{++}$, called cap layer,
- two ohmic contact pads 5A and 5B for forming the electric source and drain contacts of the transistor; these pads are provided on the surface of the cap layer by means of a metal/semiconductor alloy;
- a metal gate pad 8 deposited directly on the material of the upper active layer 13 for forming a Schottky barrier.

This Schottky barrier must lie at a very accurate distance from the bottom of the active layer 13, i.e. at a very accurate distance from the interface 20 of the heterostructure formed by the layers 13 and 10.

With reference to FIG. 1, a better operation and a better performance of the transistor are obtained when the gate contact 8 is arranged in a first recess 42, 52 whose bottom 42 is at an exact distance from the interface 20 of the heterostructure. This distance represents the effective thickness of the active layer 13. This thickness governs the operation of the transistor, i.e. its pinch-off voltage. The transistor may be, for example, of the enhancement type, or a normally-OFF transistor, or alternatively of the depletion type, or normally-ON transistor.

It should be noted that the practical realisation of transistors involves manufacturing efficiency problems. The manufacturing efficiency is considered good when the transistor performance is uniform over the entire surface of the semiconductor wafer processed, i.e. lies within a predetermined range of characteristics. In particular, this performance must be uniform from one edge of the wafer to the other (generally across a diameter of 7.6 cm=3"), and from one wafer to the next.

An example which may be given is that a field effect transistor of the enhancement type has a distance between the gate contact 8 and the interface 20 of the heterostructure of the order of 20 nm, obtained through burrowing of the channel in the upper active layer 13, which itself is of the order of 50 nm. This transistor operates between 200 mV and 700 mV with a pinch-off voltage of the order of 350 mV. Any error in the placement of the bottom of the gate recess will create an error in the pinch-off voltage. For example, an error equal to the height of one monolayer of crystalline semiconductor material (a monolayer having a thickness of the order of 0.3 nm) in the distance between gate contact 8 and interface 20 leads to an error of 22 mV in the pinch-off voltage. Since the final thickness of the channel layer is determined by the position of the bottom of the gate recess relative to the interface 20 of the heterostructure, it follows that a placement error of the bottom of the gate recess of a few crystalline monolayers in an enhancement-type transistor having such a narrow operating range leads to a terrible variation in the electric properties of such a transistor.

In the method according to the invention, therefore, steps are introduced for realising an extremely exact positioning of the bottom 42 of the recess which receives the gate contact 8, i.e. the first or central gate recess. The advantage of the method according to the invention is that it renders possible this positioning with a greater precision than does the known, present-art method, and generally renders possible this positioning without exceeding the permitted error band of no more than a few monolayers of crystalline semiconductor material. In addition, this positioning is not only precise, but also uniform over the entire surface area of the wafer under treatment.

A field effect transistor must in addition exhibit on the one hand a sufficiently high breakdown voltage and on the other hand sufficiently low access resistances.

It was found that the breakdown voltage value may be improved in that a field effect transistor is made with a double gate recess structure, forming a buried channel at two different levels (two-stage recess).

In FIG. 1, the HEMT thus comprises also a second gate recess 22, 64 whose bottom 22 is at a level different from that of the bottom 42 of the first gate recess 42, 52 which contains the gate contact 8. The bottom 22 of this second recess is at a greater distance from the interface 20 of the heterostructure 13/10. In other words, the first gate recess 42, 52 is deeper than the second gate recess 22, 64.

Moreover, the first gate recess has flanks which are not far removed from the metal of the gate contact 8, whereas the second gate recess has flanks 64 which are further removed from this contact 8, i.e. has greater transverse dimensions.

To avoid nevertheless an increase in the gate-source resistance of undesirable proportions owing to the presence of the second gate recess, a compromise must be found for the dimensions of this second recess. On the one hand, in fact, the distance between the gate contact 8 and the lateral edge of the semiconductor material must be small for achieving low access resistances. On the other hand, this distance must be sufficiently great for avoiding breakdown at high voltage levels.

In the method according to the invention, therefore, steps are introduced for realising a very precise placement of the flanks 52 of the first recess; of the bottom 22 of the second recess; and of the flanks 64 of the second recess.

The method according to the invention thus renders it possible to position the first and the second recess with high precision so that the desired compromise as to the dimensions of the two-stage recess structure is obtained, a highest possible breakdown voltage is obtained without an appreciable increase in the access resistances, while these dimensions are uniform over the entire surface area of the wafer under treatment In FIG. 1, the structure of the HEMT advantageously has a cap layer 4. The first function of this cap layer 4 is to reduce the source and drain resistances of the transistor made by the method according to the invention. This strongly $n^{++}$ doped layer 4 in fact increases the conduction of the semiconductor material in the regions situated below the ohmic source and drain contacts 5A, 5B.

Another function of this cap layer 4 is to space the regions lying below the ohmic source and drain contacts apart from the channel region, which former regions are mechanically and electrically disturbed during the eutectic fusion for forming the metal semiconductor alloy which forms the ohmic contacts 5A and 5B.

The method according to the invention for forming the two-stage gate recess with the desired accuracy in a transistor structure including the presence of the cap layer 4 will be described below with reference to FIGS. 2A to 2F.

It comprises the implementation of etching treatments in this structure, including the self-alignment of these etching treatments on the mask opening of the gate contact.

According to this method, therefore, a single, conventional masking layer, for example of photoresist, is used, and not two layers as in the prior art.

Figure 2A:
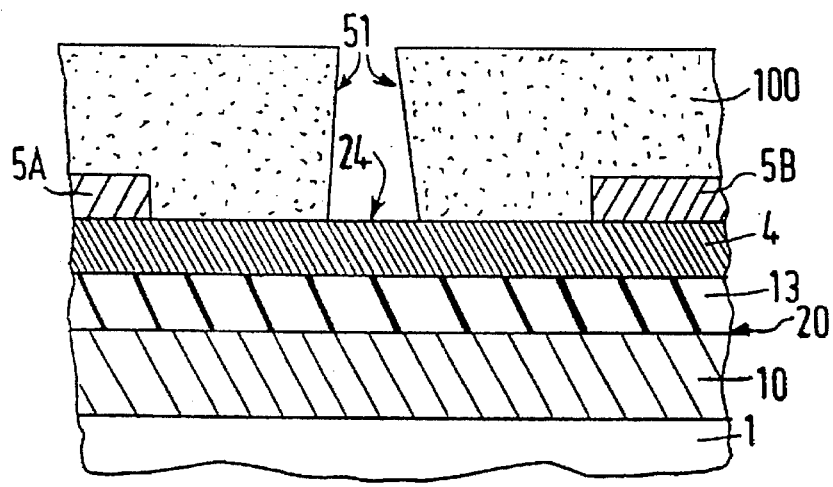
FIGS. 2A to 2F show the various steps in the method of realising the transistor of FIG. 1.

In FIG. 2A, the method comprises the formation of the stack of semiconductor material layers, with at least:

the formation of a substrate 1 of semi-insulating gallium arsenide, growing of a gallium arsenide layer 10 which is not intentionally doped, to a thickness which lies between 100 and 1000 nm, preferably 400 nm, which is the layer of small forbidden bandwidth, growing of a layer 13 of gallium-aluminium arsenide (GaAlAs) with an aluminium (Al) concentration of the order of 22%, strongly $n^{++}$ doped, for example with dopants such as silicon (Si) in a quantity higher than or equal to $10^{18} \times cm^{-2}$, to a thickness of between 20 and 80 nm, preferably 50 nm, which is the layer of greater forbidden bandwidth than the subjacent layer 10.

These layers may be realised through epitaxial growth on the semi-insulating substrate.

Figure 3:
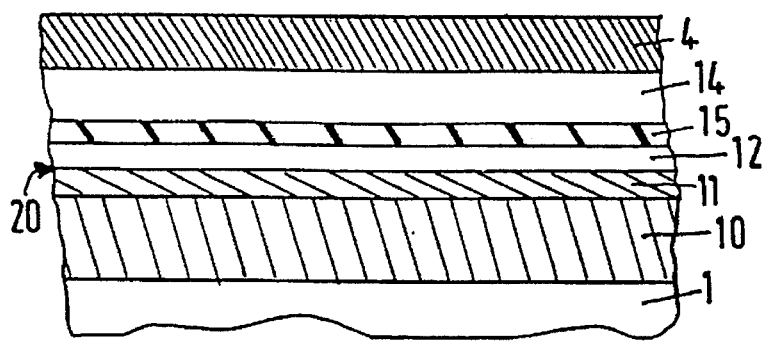
FIG. 3 shows an advantageous modification of the stack of semiconductor layers for realising a pseudomorphic HEMT.

In a modification shown in FIG. 3, this stack of layers may comprise, starting from the substrate 1:

growing of the gallium arsenide (GaAs) layer 10 which is not intentionally doped, called buffer layer here, having the thicknesses given above for the layer also having reference numeral 10;

growing of a gallium-indium arsenide (GaInAs) layer 11, called channel layer here, having an indium concentration of the order of 22% and not intentionally doped, whose thickness lies between 0 and 30 nm, preferably 10 nm;

growing of a spacer layer 12 of gallium-aluminium arsenide (GaAlAs), having an aluminium (Al) concentration of the order of 22% and not intentionally doped, whose thickness lies between 0 and 5 nm, preferably 3 nm;

growing of a gallium-aluminium arsenide (GaAlAs) layer 15, here called carrier supplying layer, having an aluminium (Al) concentration of the order of 22% and strongly $n^{++}$ doped at a doping rate higher than $10^{18} \times cm^{-3}$, whose thickness lies between 0.3 nm (a crystalline monolayer) and 40 nm, preferably 25 nm;

growing of a gallium-aluminium arsenide (GaAlAs) layer 14, here called Schottky layer, having an aluminium (Al) concentration of the order of 22% and not intentionally doped, with a thickness of 10 to 40 nm, preferably 25 nm;

growing of the cap layer 4 of gallium arsenide (GaAs) strongly $n^{++}$ doped with a doping rate higher than $10^{18} \times cm^{-3}$, with a thickness lying between 5 and 100 nm, preferably 50 nm.

In this system of layers, the indium-gallium arsenide (GaInAs) material for the channel layer 11 has a small forbidden bandwidth, whereas the gallium-aluminium arsenide (GaAlAs) for the non-doped spacer layer 12, the strongly doped carrier supplying layer 15, and the Schottky layer 14, in that order, has a greater forbidden bandwidth. Under these conditions, a bidimensional electron gas will be established at the interface 20 of the spacer 12/channel 11 layers, of different forbidden bandwidths. The HEMT including this arrangement is known under the designation pseudomorphic high electron mobility transistor, and at present has a better performance than the HEMT of simpler structure described further above because the difference between the forbidden bandwidths of the material is greater in the peseudomorphic structure.

Nevertheless, the method according to the invention may be applied to the realisation of any transistor with a two-stage gate recess in which the stack of layers in whose upper portion the two-stage recess is provided comprises at least:

an upper layer 13 or 14 on which the Schottky contact is formed in a first recess whose semiconductor material has at least a non-zero aluminium content; a non-zero content is understood to mean an aluminium (Al) concentration of 0.1 in the formula of the semiconductor compound, which is already sufficient for carrying out the invention;

a cap layer 4 of which the semiconductor material does not comprise aluminum.

Following the realisation of the stack of layers of semiconductor materials, for example through epitaxial growth, favourably by means of a technique known to those skilled in the art such as molecular beam epitaxy (MBE) or organic chemical vapour deposition (MOCVD), the manufacturing method of the transistor comprises:

the realisation of ohmic source and drain contacts 5A and 5B by any method known to those skilled in the art.

Figures 2B, 2C:
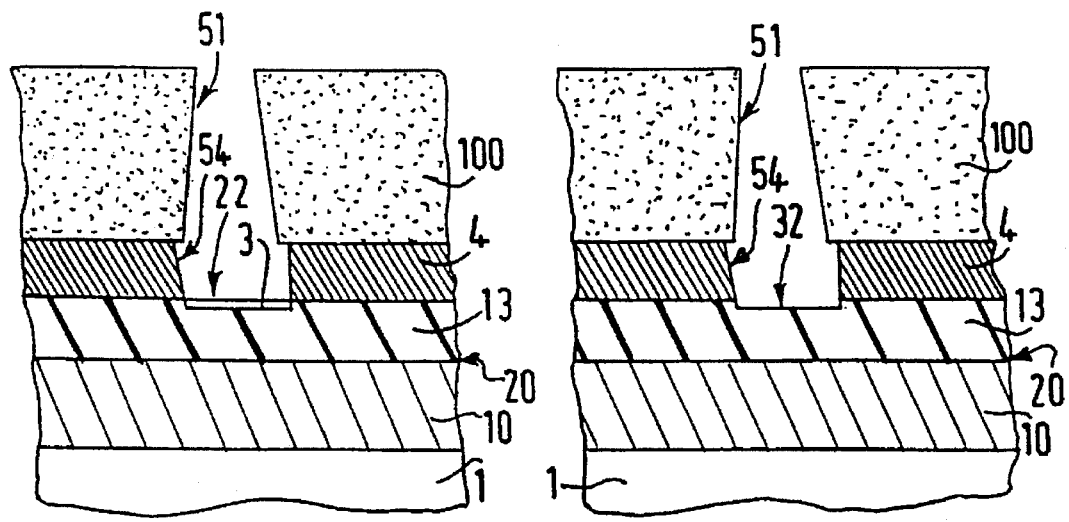

Then the method of providing the two-stage gate recess is carried out. According to the invention, this method comprises specifically:

as shown in FIG. 2A, the formation of a mask 100 of photoresist provided with an opening 51, which may be of micron or submicron dimensions, for defining the future gate contact 8; all subsequent openings to be formed in the method will be self-aligned relative to this gate opening 51; said gate opening 51 exposes the upper surface 24 of the cap layer 4. The mask 100 is provided with micron or submicron precision by any method known to those skilled in the art, for example, by means of an electron beam, delimiting the gate openings of micron or submicron dimensions;

as shown in FIG. 2B, etching of an opening having flanks 54 in the cap layer 4 down to the upper surface 22 of the subjacent layer 13 or 14 (depending on whether a HEMT or pseudomorphic HEMT is being made), in a semiconductor material which comprises the element aluminium (Al); this etching step is carried out by a reactive ion etching method (RIE) with a plasma formed by an active compound which comprises at least fluorine (F), with for example chlorine (Cl); for example, the plasma used may favourably include $C_2Cl_2F_2$, or alternatively a mixture of $SiCl_4$ and $SF_6$; under these conditions the etching of the cap layer material 4, which is gallium arsenide (GaAs) in the present example, is selective relative to the material of the subjacent layer 13 or 14 which in the present example is gallium-aluminium arsenide (GaAlAs).

Figures 2D, 2E:
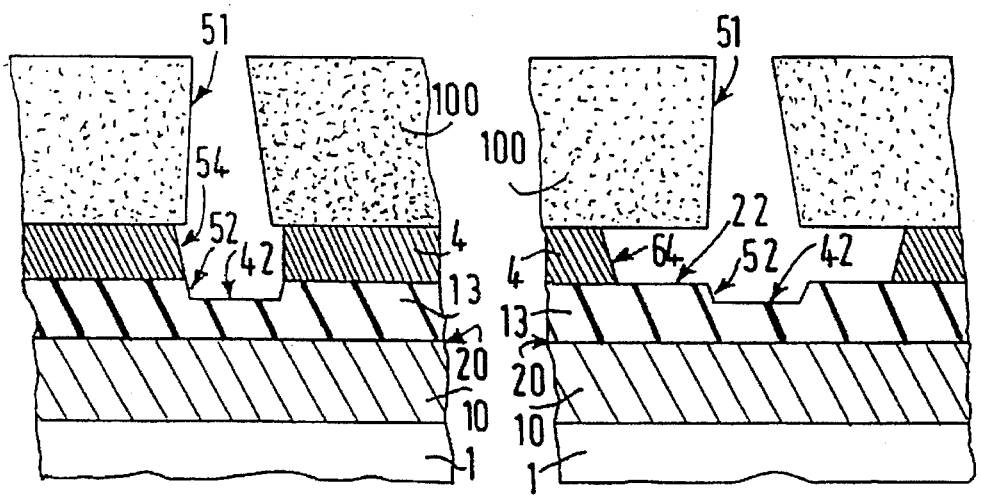

In the method according to the invention, this etching step STOPS AUTOMATICALLY at the level of the upper surface 22 of the subjacent layer 13 or 14 thanks to the SYSTEMATIC formation of a stopper layer 3 of aluminium fluoride ($AlF_3$) through reaction between the element fluorine (F) present in the etchant and the element aluminium (Al) present in the material (GaAlAs) of said subjacent layer 13 or 14; said stopper layer 3 usually has a spontaneous thickness of one or two atomic monolayers (0.3 to 0.6 nm);

as shown in FIG. 2C, elimination of the stopper layer 3 of aluminium fluoride ($AlF_3$) formed systematically in the preceding step through washing by means of a simple immersion operation of the support wafer 1 in water; this results in the appearance of a surface 32 of the material of the subjacent layer 13 or 14 of gallium-aluminium arsenide (GaAlAs); the stopper layer 3 can be removed by this simple method because it is very thin;

as shown in FIG. 2D, etching of said first, central gate recess 52, 42 through the openings 51 in the photoresist layer 100 and 54 in the cap layer 4.

This etching step may be carried out by a reactive ion etching (RIE) method with a plasma comprising an etchant without fluorine such as $Cl_2$ or $BCl_3$.

In an advantageous modification, this etching step may be carried out in the wet state by means of a mixture of $H_3PO_4$ or $H_3NO_4$ with $H_2O_2$ and $H_2O$, in mutual proportions of 3:1:20. The advantage of this is that the etched surfaces obtained are clean and not disturbed by the etching process.

This step carded out by either of the above methods renders possible a precise positioning of the bottom 42 of the first gate recess relative to the upper surface 22 of the etched layer 13 or 14 because this surface 22 was defined by the stopper layer 3 and now serves as a reference for the starting level in etching the first, central recess for the gate, and because the thickness to be etched away in this step is always small: this thickness for etching is of the order of 6 nm for obtaining a depletion-type transistor and 15 nm for obtaining an enhancement-type transistor, while the active layer has a thickness of 50 nm opposite the heterostructure interface.

Those skilled in the art know how to carry out such an etching step with the required accuracy of at most a few monolayers of semiconductor material because this etching starts from a surface 22 which is accurately located, and because the whole etching operation for obtaining the bottom 42 of the first recess takes place continuously in one single step.

The etching rate is a function of the etchant concentration which is known with a high degree of accuracy; the depth etched is a function of the etching rate and the etching time.

Since the thickness to be etched away is small (6 to 15 nm), the possible error in the etched thickness from one end of the wafer to the other is small; the accuracy of the total number of transistors of the wafer remains within the accuracy range envisaged. Electrical tests may be carried out during the etching process for verifying parameters which are a function of the etching depth.

According to the present art, on the contrary, the positioning of this bottom of the first recess was not exact because it was achieved in two steps, with a resumption of etching between.

Figure 2F:
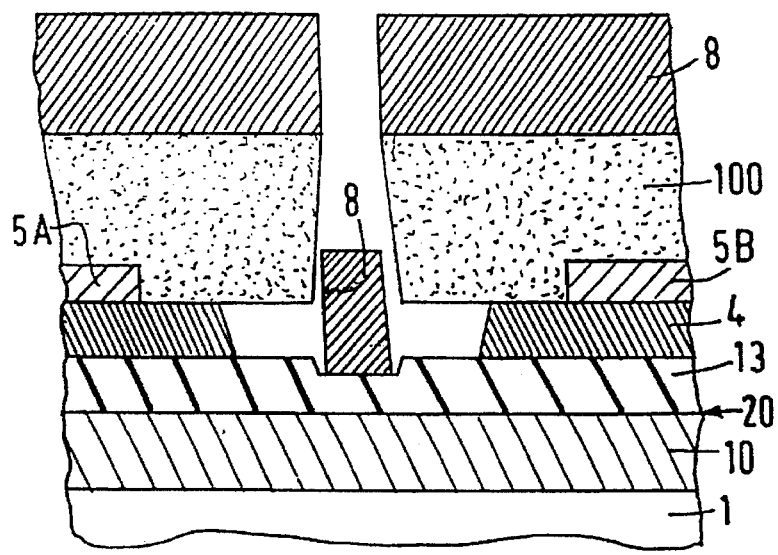

Another advantage of the invention is that the stopper layer 3 whose surface coincided with that of the gate opening is now removed. The finished transistor thus does not include non-eliminated portions of etching stopper layers which, if they remain present, create parasitic resistances; or wells which have trapping effects, or alternatively lead to breakdown risks.

as shown in FIG. 2E, etching of the second gate recess whose flanks have reference numeral 64 and whose bottom is formed by the upper surface 22; this etching step is carded out in the cap layer 4 through reactive ion etching (RIE) by means of the plasma of the first RIE step, with etchants such as $CCl_2F_2$ or a mixture of $SiCl_4$ and $SF_6$, which renders possible a selective etching of the cap layer 4 of GaAs relative to the subjacent layer 13 or 14 of GaAlAs. Since this etching is selective, it proceeds exclusively laterally in the cap layer 4. Those skilled in the art know how to control such an etching process via the etching rate and the etching time for obtaining a very accurate transverse dimension of this second gate recess, whose depth is defined with precision because it cannot go beyond the upper surface 22 of the subjacent layer 13 or 14. During this etching step, the first, central gate recess is obviously not deepened;

if the etching of the recess 52, 42 was done by RIE, it is possible to provide a wet etching treatment for eliminating over a very small number of monolayers the stresses and defects produced during this dry etching step by means of a mixture with $H_3PO_4$ or $H_3NO_4$, with $H_2O_2$ and $H_2O$ in the proportions 3:1:20. Alternatively, it is possible to provide a heat treatment for eliminating these stresses.

as shown in FIG. 2F, deposition of a metal layer 8, 80; this deposition is performed through the gate opening 51 for realising the metal gate contact pad 8 with the precision of this gate opening 51 and in contact with the bottom 42 of the first, central recess; this deposition also takes place at the surface of the photoresist layer 100; this photoresist layer 100 is subsequently eliminated by a known lifting-off method, taking along the portion (80) of the metal layer which is not required for the gate pad 8.

We claim:

1. A method of manufacturing a semiconductor device comprising a buried channel field effect transistor, comprising at least:

realization of a stack of layers on a substrate, the stack including:
   an active layer made of a semiconductor compound with a non-zero aluminium (Al) content in which a first, central gate recess is to be dug for receiving a Schottky gate contact,
   a cap layer, disposed over said active layer, made of a semiconductor material without aluminium (Al) for receiving ohmic source and drain contacts of the transistor,
   a masking layer, disposed over said cap layer, provided with a gate opening,
   carrying out of etching steps for providing the first, central gate recess by self-alignment on the gate opening, comprising:
   a first selective etching step with a first etching compound of fluorine (F) carried out in the cap layer through the gate opening and down to the upper surface of the active layer, on which an etching stopper layer of aluminium fluoride ($AlF_3$) will be formed automatically through a reaction between the fluorine (F) of the etching compound and the aluminium (Al) of the semiconductor compound of the active layer,
   eliminating of the etching stopper layer of aluminium fluoride ($AlF_3$),
   a second, non-selective etching step carried out in the active layer through the gate opening with a second etching agent until the first, central gate recess has been completed.

2. A method as claimed in claim 1, characterized in that is comprises in addition, for making a second central gate recess which is less deep and which has greater lateral dimensions than the first, central gate recess:

the implementation of subsequent etching steps, which include:
   a third selective etching step with the first etching compound of fluorine (F), carried out in the cap layer laterally only for forming flanks of the second, central gate recess whose bottom is formed by the upper surface of a subjacent layer.

3. A method as claimed in claim 2, characterized in that the first selective etching step and the third selective etching step, are carried out by reactive ion etching (RIE) by means of a plasma comprising a fluorine compound which may be $C_2Cl_2F_2$ or a mixture of $SiCl_4$ and $SF_6$.

4. A method as claimed in claim 2, characterized in that the second, non-selective etching step is carried out by reactive ion etching (RIE) by means of a plasma comprising a compound without fluorine.

5. A method as claimed in claim 4, characterized in that it comprises a final treatment after the third selective etching step for eliminating surface stresses and defects from surfaces of any of the stack of layers etched by RIE, by means of a mixture of $H_3PO_4$ or $H_3NO_4$ with $H_2O_2$ and $H_2O$ in the proportions 3:1:20.

6. A method as claimed in claim 1, characterized in that the second, non-selective etching step is carried out by wet etching with an etching agent without fluorine.

7. A method as claimed in claim 2, characterized in that:
the step of eliminating of the etching stopper layer of aluminium fluoride is carried out through washing in water ($H_2O$).

8. A method as claimed in claim 1, characterized in that, for the formation of a high electron mobility field effect transistor (HEMT), the stack of layers starting from the substrate comprises at least the following:

a first layer of a semiconductor compound of a selected forbidden bandwidth, a second layer of a semiconductor compound having a non-zero aluminium content, and with a forbidden bandwidth greater than the forbidden bandwidth of the first layer and being doped at a level sufficiently high so as to form a heterostructure with the first layer, in which second layer the first gate recess is formed for receiving a Schottky gate contact, the distance between the bottom of this first recess and the interface of the heterostructure being controlled for obtaining a transistor which has a pinch-off voltage of a given value, such as an enhancement-type or depletion-type transistor.

9. A method as claimed in claim 1, characterized in that, for forming a pseudomorphic high electron mobility field effect transistor (HEMT), the stack of layers starting from the substrate comprises:

a buffer layer which is not intentionally doped and is made of a semiconductor compound of selected forbidden bandwidth, a channel layer which is not intentionally doped and is made of a semiconductor compound of selected forbidden bandwidth, a spacer layer which is not intentionally doped and is made of a semiconductor compound of selected forbidden bandwidth, forming a heterostructure with the subjacent layer, the forbidden bandwidth of the spacer layer being greater than the forbidden bandwidth of the subjacent layer, a carrier supplying layer which is strongly doped and made of a semiconductor compound of selected forbidden bandwidth, the forbidden bandwidth of the carrier layer being greater than the forbidden bandwidth of the layer subjacent to the spacer layer, a Schottky layer which is not intentionally doped, which has a non-zero aluminum content, which has a selected forbidden bandwidth that is greater than the forbidden bandwidth of the layer subjacent to the spacer layer, and in which the first gate recess is formed for receiving a Schottky gate contact, the distance between the bottom of the latter recess and the interface of the heterostructure being strictly controlled for obtaining a transistor with a pinch-off voltage of a given value, such as a depletion-type or enhancement-type transistor.

10. A method as claimed in claim 9, characterized in that the semiconductor compound of at least one of the buffer and channel layers is gallium arsenide (GaAs) or gallium-indium arsenide (GaInAs), and in that the semiconductor compound of at least one of the spacer, carrier supplying and Schottky layers is gallium aluminum arsenide (GaAlAs).

11. A method as claimed in claim 8, characterized in that the semiconductor compound of the first layer is gallium arsenide (GaAs) or gallium-indium arsenide (GaInAs), and in that the semiconductor compound of the second layer is gallium-aluminum arsenide (GaAlAs).

12. A method as claimed in claim 1, characterized in that the first selective etching step is carried out by reactive ion etching (RIE) by means of a plasma comprising a fluorine compound of $C_2Cl_2F_2$ or a mixture of $SiCl_4$ and $SiF_6$.

13. A method as claimed in claim 12, characterized in that the second, non-selective etching step is carried out by reactive ion etching (RIE) by means of a plasma comprising a compound without fluorine.

14. A method as claimed in claim 3, characterized in that the second, non-selective etching step is carried out by reactive ion etching (RIE) by means of a plasma comprising a compound without fluorine.

15. A method as claimed in claim 14, characterized in that it comprises a final treatment after the third selective etching step for eliminating surface stresses and defects from surfaces of any of the stack of layers etched by RIE, by means of a mixture of $H_3PO_4$ or $H_3NO_4$ with $H_2O_2$ and $H_2O$ in the proportions 3:1:20.

16. A method as claimed in claim 6, wherein the etching agent is a mixture of $H_3PO_4$ or $H_3NO_4$ with $H_2O_2$ and $H_2O$ in the respective proportions 3:1:20.

17. A method as claimed in claim 1, characterized in that:
the step of eliminating of the etching stopper layer of aluminium fluoride is carried out through washing in water ($H_2O$).

18. A method as claimed in claim 4, wherein the compound without fluorine comprises $Cl_2$ or $BCl_3$.

19. A method as claimed in claim 13, wherein the compound without fluorine comprises $Cl_2$ or $BCl_3$.

20. A method as claimed in claim 10, wherein the cap layer is made of gallium arsenide (GaAs).

21. A method as claimed in claim 11, wherein the cap layer is made of gallium arsenide (GaAs).

\* \* \* \* \*